(12) United States Patent
Hsieh

(10) Patent No.: US 8,779,295 B2
(45) Date of Patent: Jul. 15, 2014

(54) PARTITION POST USED ON PRINTED CIRCUIT BOARD

(75) Inventor: Shu-Li Hsieh, New Taipei (TW)

(73) Assignee: Kang Yang Hardware Enterprises Co., Ltd., New Taipei (TW)

( * ) Notice: Subject to any disclaimer, the term of this patent is extended or adjusted under 35 U.S.C. 154(b) by 297 days.

(21) Appl. No.: 13/430,992

(22) Filed: Mar. 27, 2012

(65) Prior Publication Data

US 2013/0255993 A1    Oct. 3, 2013

(51) Int. Cl.
  *H05K 7/02* (2006.01)
  *H05K 7/00* (2006.01)
(52) U.S. Cl.
  USPC .............. 174/138 D; 174/135; 174/138 G; 361/740; 361/801; 24/3.1; 24/594.1
(58) Field of Classification Search
  USPC .......... 174/135, 138 D, 138 G; 361/740, 753, 361/759, 799, 796, 801, 802, 804, 807, 809, 361/810; 24/594.1, 3.1, 421, 424, 331, 334, 24/338, 371, 499, 500, 501, 509, 523, 24/582.11, 587.1, 599.6, 599.7, 611, 613, 24/628, 677, 708.3
  See application file for complete search history.

(56) References Cited

U.S. PATENT DOCUMENTS

| | | | |
|---|---|---|---|
| 6,140,591 A * | 10/2000 | Osborne et al. | 174/138 E |
| 6,164,980 A * | 12/2000 | Goodwin | 439/70 |
| 6,786,691 B2 * | 9/2004 | Alden, III | 411/371.2 |
| 7,333,340 B2 * | 2/2008 | Zhang et al. | 361/719 |
| 7,606,031 B2 * | 10/2009 | Hsieh et al. | 361/700 |
| 8,587,954 B2 * | 11/2013 | Hsieh et al. | 361/759 |
| 2004/0081529 A1 * | 4/2004 | Stanton et al. | 411/44 |

* cited by examiner

*Primary Examiner* — Angel E Estrada
*Assistant Examiner* — Dimary Lopez Cruz
(74) *Attorney, Agent, or Firm* — Guice Patents PLLC

(57) ABSTRACT

The present invention relates to a partition post used on a printed circuit board, which comprises an insulation post member and an electric conductive spring. The top and the bottom of the insulation post member are respectively and protrudingly installed with an upper and a lower connection rings, and the bottom surface of the lower connection ring is longitudinally extended with an arrow-shaped elastic buckle claw; the electric conductive spring is sleeved on the insulation post member, the top and the bottom thereof are respectively installed with an upper and a lower guide parts composed of plural spiral rings and at the locations corresponding to the upper and the lower connection rings; so static electricity and/or noise signal generated by each electric component on the printed circuit board can be transmitted through the electric conductive spring to the electric conductive member and thereby providing a grounding effect.

17 Claims, 11 Drawing Sheets

PARTITION POST USED ON PRINTED CIRCUIT BOARD

BACKGROUND OF THE INVENTION

1. Field of the Invention

The present invention relates to a partition post capable of being used for installing and fastening a printed circuit board, especially to a partition post capable of stably positioning the printed circuit board and having a grounding effect.

2. Description of Related Art

In a general computer or an electronic device, for installing a printed circuit board on a fixed substrate of a housing, a screw post or engagement post is often provided on the fixed substrate then the printed circuit board is installed on the columnar post.

The above-mentioned screw post has a columnar body installed between the printed circuit board and the fixed substrate, one end of the columnar body is formed with a thread portion, the other end is formed with a screw hole at the center, the thread portion of the columnar body is screw-fitted with the fixed substrate, and the screw hole allows a screw to pass a positioning hole formed on the printed circuit board then be screw-fitted, thereby fastening the printing circuit board and forming an interval with respect to the fixed substrate.

In conventional engagement post, one end of the main body is installed with an elastic buckle claw for being inserted in a positioning hole formed on the printed circuit board thereby generating a buckle connection effect; the other end surface is abutted against the fixed substrate, thereby forming an interval between the printed circuit board and the fixed substrate.

With the trend of electronic device to be lighter, thinner, shorter and smaller, the internal space inside a computer or an electronic device is greatly reduced, so the electric components installed on a printed circuit board are more compact; however, all electric components would generate electromagnetic interfere (EMI). As such, a metal housing is often covered at the exterior of the printed circuit board for the purpose of shielding; because the metal housing is often installed with a grounding pin, or the printed circuit board is installed with an electric conducive elastic sheet for being in contact with the metal housing, and the grounding pin or the electric conductive elastic sheet is installed on the printed circuit board for the purpose of grounding and reducing the electromagnetic interfere.

However, the above-mentioned electric conductive elastic sheet can be used for transmitting static electricity and/or noise signal to the exterior through a grounding path thereby eliminating the electromagnetic interfere. Instead of integrating, the electric conductive elastic sheet and the partition post individually provide the positioning and the grounding function to the printed circuit board, thereby causing the complicated assembly procedure and shall be improved by the skilled people in the art.

SUMMARY OF THE INVENTION

One primary objective of the present invention is to provide a partition post used on a printed circuit board, thereby providing a stale supporting and positioning effect to the printed circuit board, a columnar body of the partition post is sleeved with an electric conductive spring, so static electricity and/or noise signal generated by each electric component on the printed circuit board can be transmitted through the electric conductive spring to an electric conductive member, e.g. a fixed substrate of a metal housing, thereby providing a grounding effect.

For achieving the objective, one technical solution provided the present invention is to provide a partition post used on a printed circuit board, which comprises: an insulation post member, the top and the bottom of a columnar body defined at the mid portion thereof are respectively and protrudingly installed with an upper an a lower connection rings, the peripheries of the upper and the lower connection rings are respectively and longitudinally formed with at least an upper and at least a lower through slots communicating with the columnar body, and the bottom surface of the lower connection ring is longitudinally extended with an arrow-shaped elastic buckle claw having the inner side being formed with at least a retractable slit; and an electric conductive ring, the mid portion thereof defined as a connection portion is connected to the columnar body, the top and the bottom of the connection portion are respectively and longitudinally extended with an upper and a lower positioning segments received in the upper and the lower through slots, the upper and the lower positioning segments are respectively and longitudinally connected with an upper and a lower guide parts composed of plural spiral rings, and the upper and the lower guide parts are respectively disposed above the upper connection ring and between the lower connection ring and the elastic buckle claw.

Another technical solution provided the present invention is to provide a partition post used on a printed circuit board, which comprises: an insulation post member, the top and the bottom of a columnar body defined at the mid portion thereof are respectively and protrudingly installed with an upper and a lower connection rings, the peripheries of the upper and the lower connection rings are respectively and longitudinally formed with at least an upper and at least a lower through slots communicating with the columnar body, the top surface of the upper connection ring is longitudinally and protrudingly installed with an insertion pin, and the bottom surface of the lower connection ring is longitudinally extended with an arrow-shaped elastic buckle claw having the inner side being formed with at least a retractable slit; and an electric conductive spring, the mid portion thereof defined as a connection portion is connected to the columnar body, the top and the bottom of the connection portion are respectively and longitudinally extended with an upper and a lower positioning segments received in the upper and the lower through slots, the upper and the lower positioning segments are respectively and longitudinally connected with an upper and a lower guide parts composed of plural spiral rings, the upper and the lower guide parts are respectively disposed at the outer side of the insertion pin and between the lower connection ring and the elastic buckle claw.

One another technical solution provided the present invention is to provide a partition post used on a printed circuit board, which comprises: an insulation post member, the top and the bottom of a columnar body defined at the mid portion thereof are respectively and protrudingly installed with an upper and a lower connection rings, the peripheries of the upper and the lower connection rings are respectively and longitudinally formed with at least an upper and at least a lower through slots communicating with the columnar body, and the top surface of the upper connection ring and the bottom surface of the lower connection ring are respectively and longitudinally extended with an arrow-shaped elastic buckle claw having the inner side being formed with at least a retractable slit; and an electric conductive spring, the mid portion thereof defined as a connection portion is connected to the columnar body, the top and the bottom of the connection portion are respectively and longitudinally extended with an upper and a lower positioning segments received in the upper and the lower through slots, the upper and the lower positioning segments are respectively and longitudinally connected with an upper and a lower guide parts composed of plural spiral rings, the upper and the lower guide parts are respectively disposed between the upper connection ring and the elastic buckle claw and between the lower connection ring and the elastic buckle claw.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
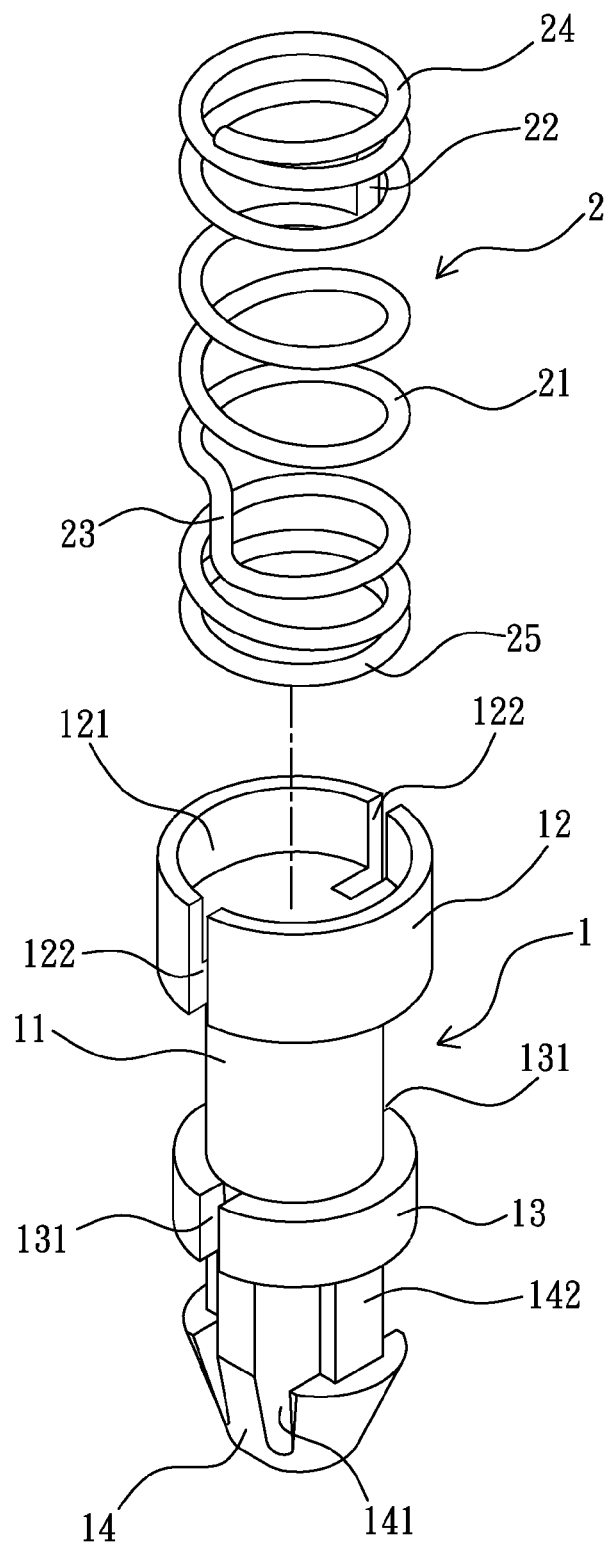
FIG. 1 is a perspective exploded view illustrating the partition post, according to the first embodiment of the present invention.
Figure 2:
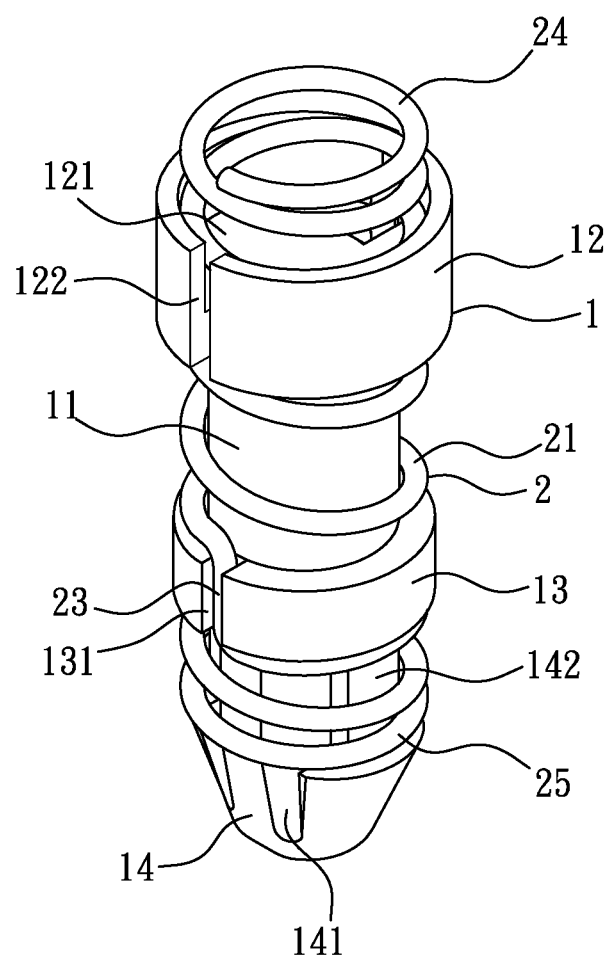
FIG. 2 is a perspective view illustrating the assembly of the partition post disclosed in FIG. 1.
Figure 3:
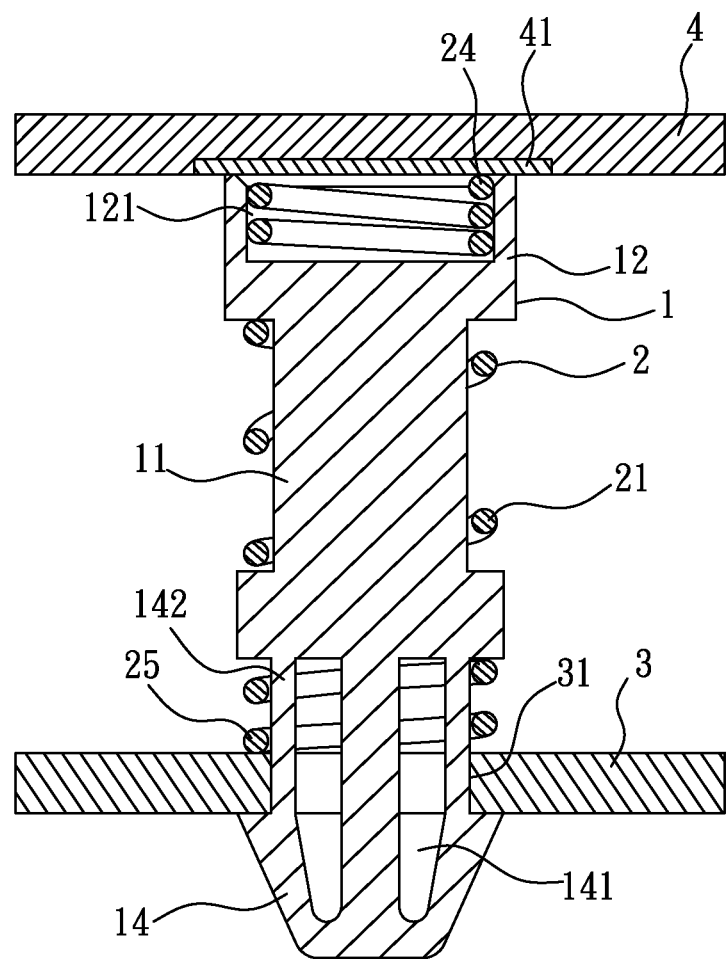
FIG. 3 is a cross sectional view illustrating the partition post being installed on a printed circuit board and an electric conductive member, according to the first embodiment of the present invention.
Figure 4:
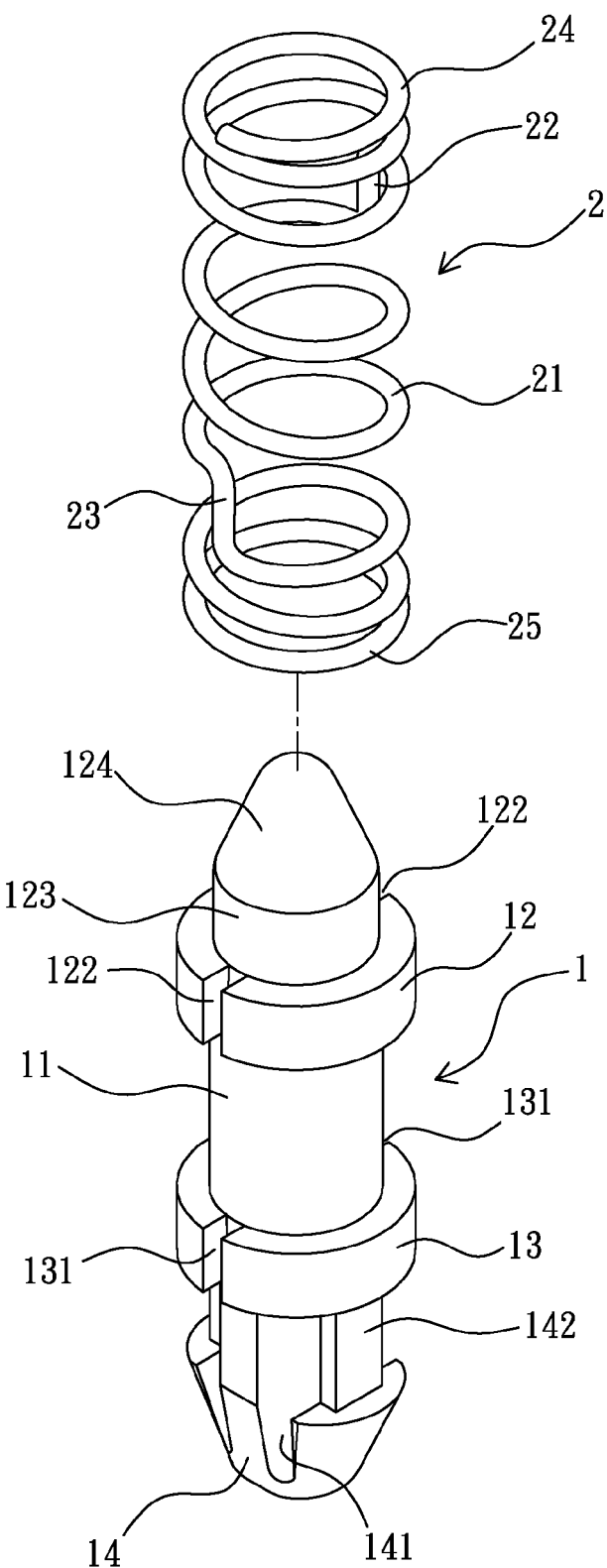
FIG. 4 is a perspective exploded view illustrating the partition post, according to the second embodiment of the present invention.
Figure 5:
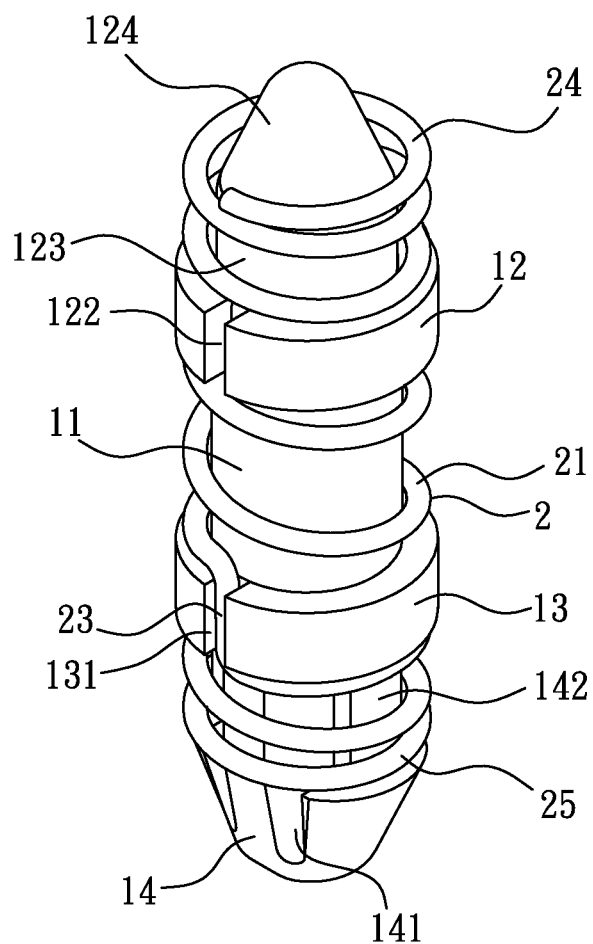
FIG. 5 is a perspective view illustrating the assembly of the partition post disclosed in FIG. 4.
Figure 6:
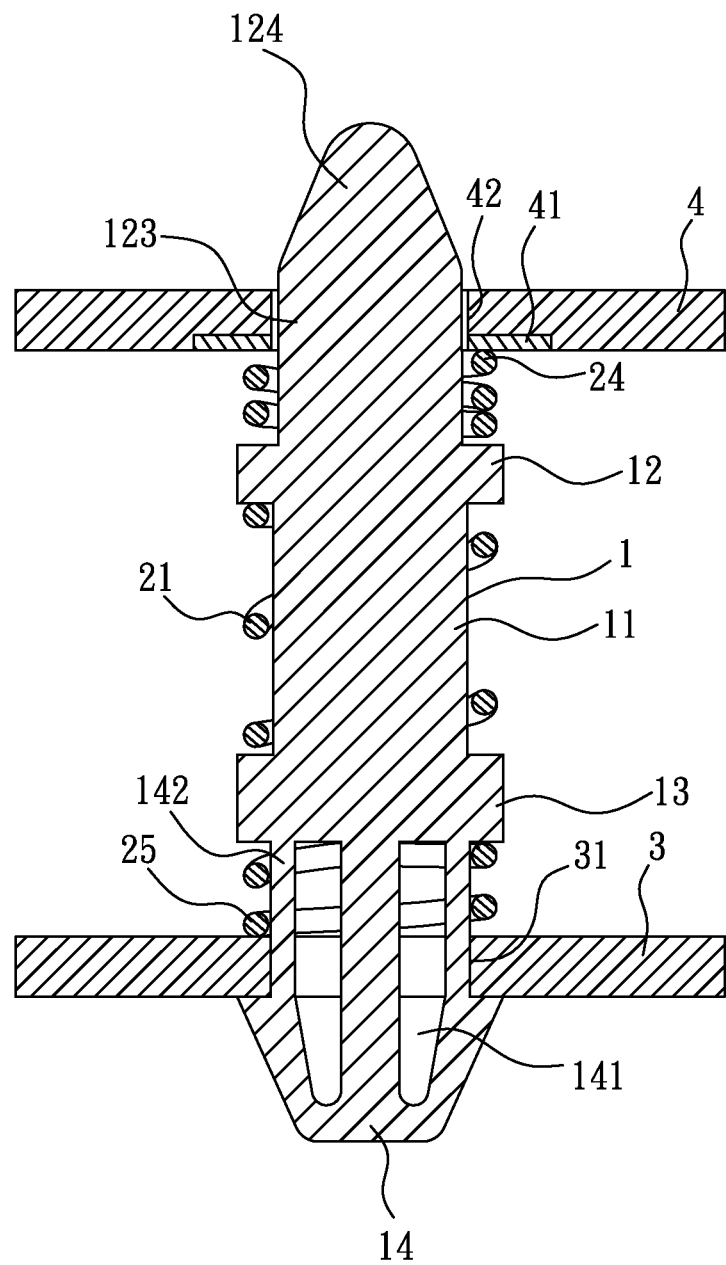
FIG. 6 is a cross sectional view illustrating the partition post being installed on a printed circuit board and an electric conductive member, according to the second embodiment of the present invention.
Figure 7:
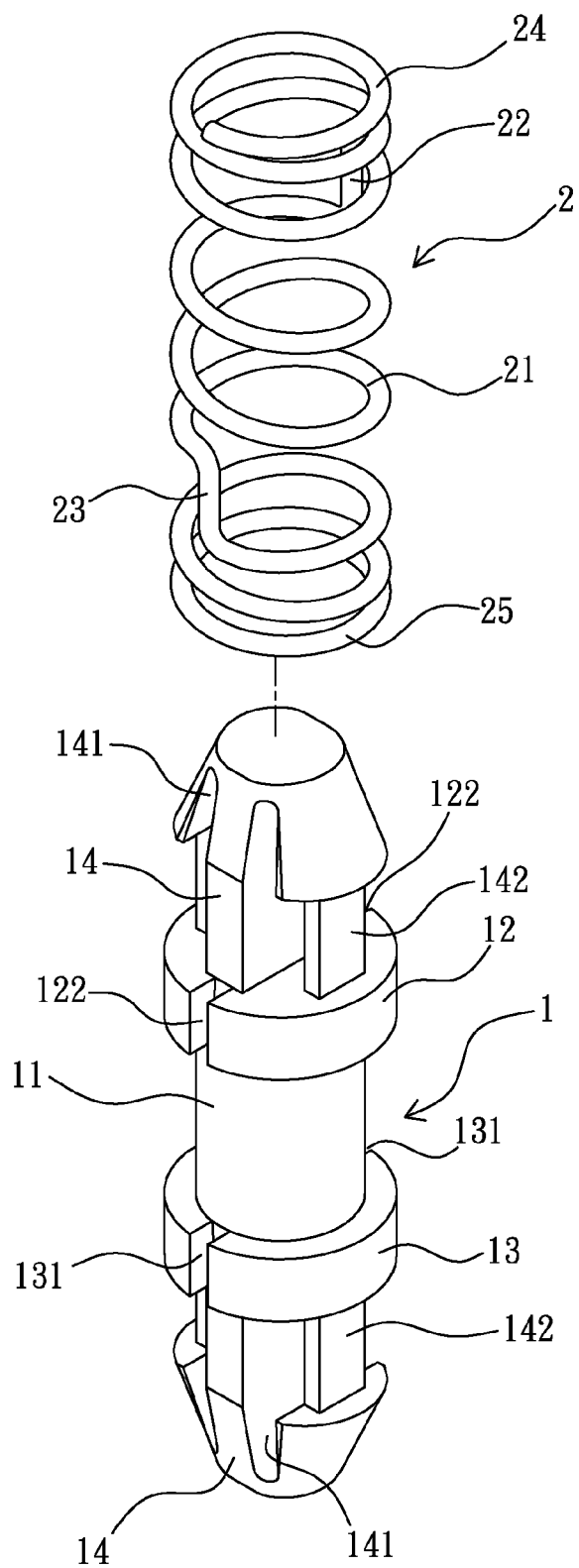
FIG. 7 is a perspective exploded view illustrating the partition post, according to the third embodiment of the present invention.
Figure 8:
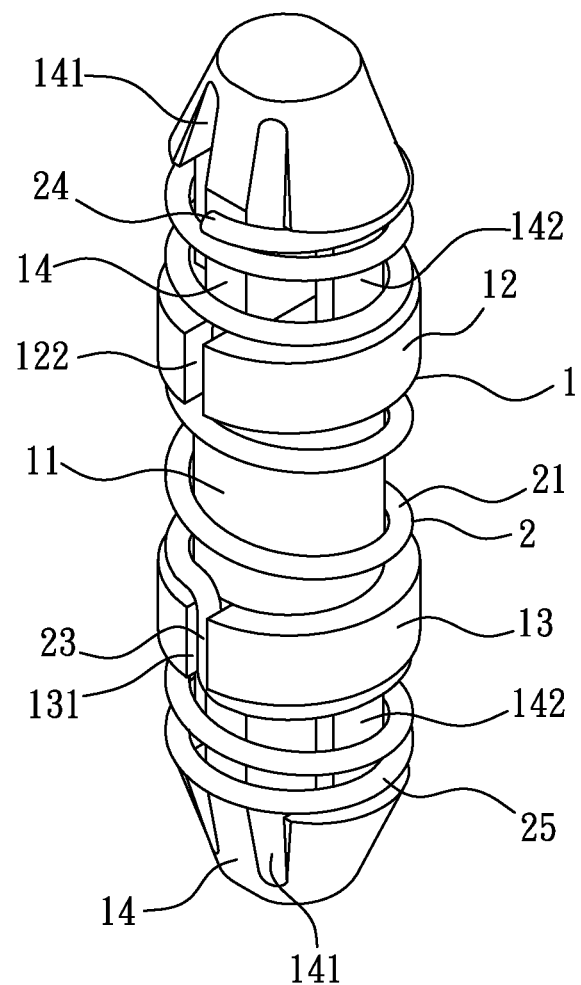
FIG. 8 is a perspective view illustrating the assembly of the partition post disclosed in FIG. 7.
Figure 9:
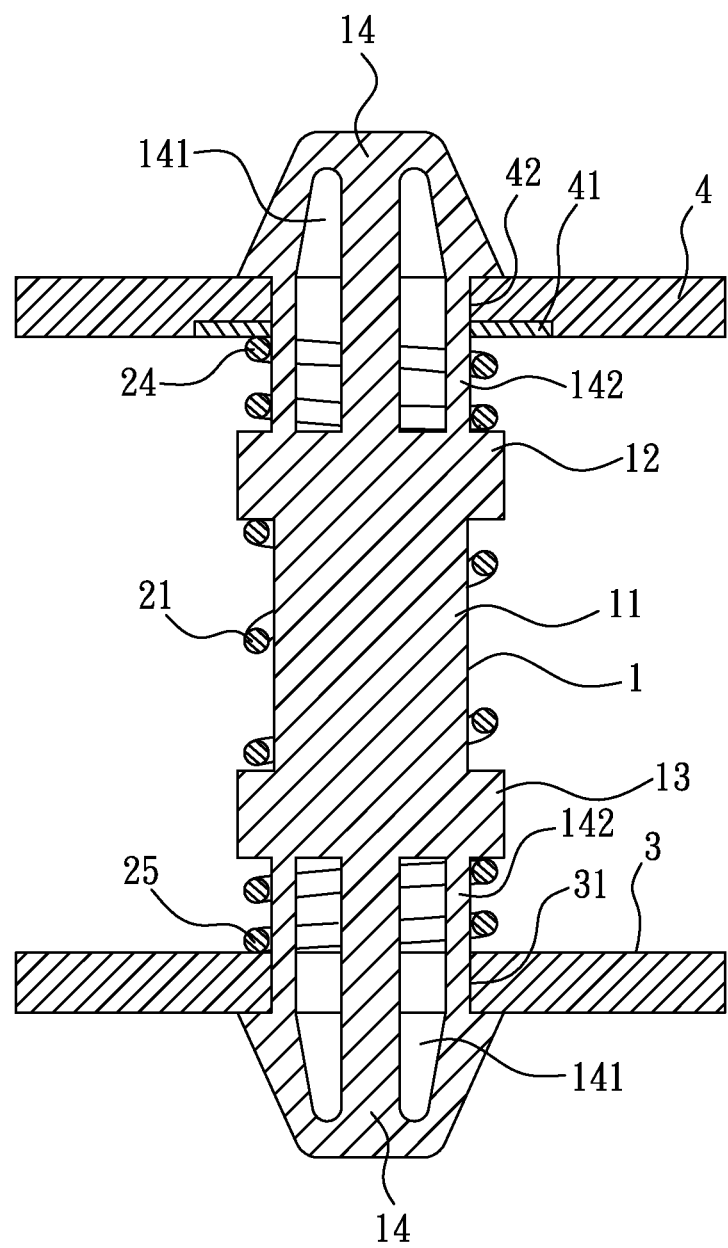
FIG. 9 is a cross sectional view illustrating the partition post being installed on a printed circuit board and an electric conductive member, according to the third embodiment of the present invention.
Figure 10:
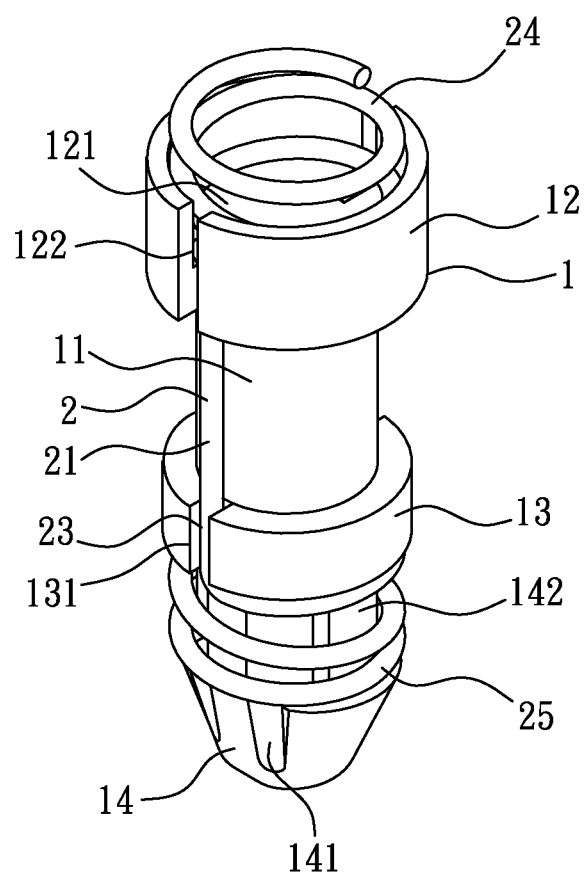
FIG. 10 is a perspective exploded view illustrating the partition post, according to the fourth embodiment of the present invention.
Figure 11:
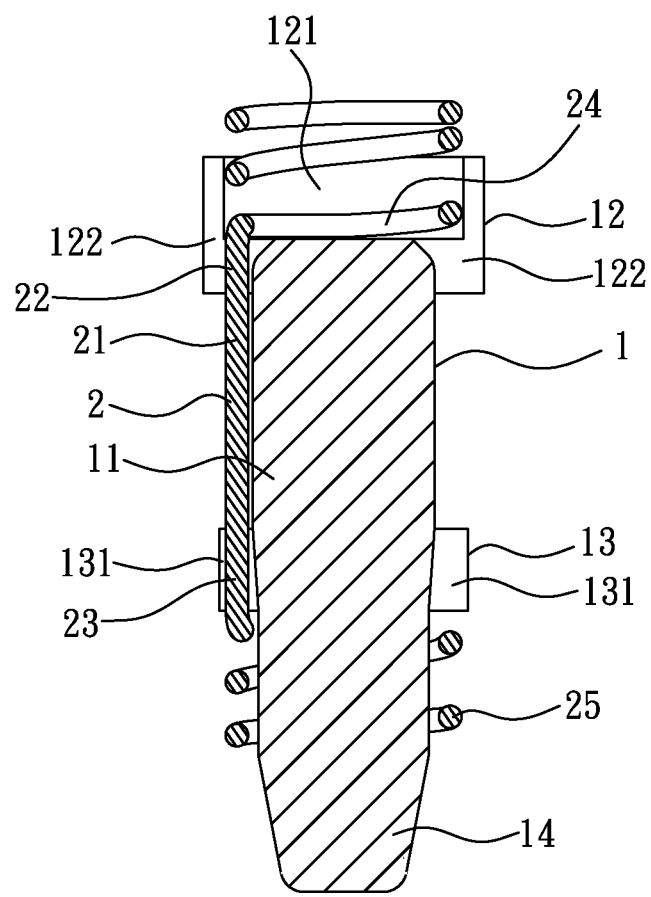
FIG. 11 is a cross sectional view illustrating the partition post, according to the fourth embodiment of the present invention.

The accompanying drawings are included to provide a further understanding of the invention, and are incorporated in and constitute a part of this specification. The drawings illustrate embodiments of the invention and, together with the description, serve to explain the principles of the invention, wherein FIG. 1 is a perspective exploded view showing the partition post, according to the first embodiment of the present invention; FIG. 2 is a perspective view showing the assembly of the partition post disclosed in FIG. 1; FIG. 3 is a cross sectional view illustrating the partition post being installed on a printed circuit board and an electric conductive member, according to the first embodiment of the present invention; FIG. 4 is a perspective exploded view showing the partition post, according to the second embodiment of the present invention; FIG. 5 is a perspective view showing the assembly of the partition post disclosed in FIG. 4; FIG. 6 is a cross sectional view illustrating the partition post being installed on a printed circuit board and an electric conductive member, according to the second embodiment of the present invention; FIG. 7 is a perspective exploded view showing the partition post, according to the third embodiment of the present invention; FIG. 8 is a perspective view showing the assembly of the partition post disclosed in FIG. 7; FIG. 9 is a cross sectional view illustrating the partition post being installed on a printed circuit board and an electric conductive member, according to the third embodiment of the present invention; FIG. 10 is a perspective exploded view showing the partition post, according to the fourth embodiment of the present invention; and FIG. 11 is a cross sectional view showing the partition post, according to the fourth embodiment of the present invention.

As shown in FIG. 1 and FIG. 2, the present invention substantially comprises an insulation post member 1 and an electric conductive spring 2.

The insulation post member 1 is integrally formed through plastic injection molding, the top and the bottom of a columnar body 11 defined at the mid portion thereof are respectively and protrudingly installed with an upper connection ring 12 and a lower connection ring 13, and the top surface of the upper connection ring is formed with an accommodation recessed slot 121, and the periphery of the recessed slot 121 is longitudinally formed with at least an upper through slot 122 communicating with the columnar body 11; the bottom surface of the lower connection ring 13 is longitudinally extended with an arrow-shaped elastic buckle claw 14, and the periphery of the lower connection ring 13 and the elastic buckle claw 14 is longitudinally formed with at least a lower through slot 131 communicating with the columnar body 11.

Referring to FIG. 1, the inner side of the elastic buckle claw 14 is formed with at least a retractable slit 141, e.g. two retractable slits 141 oppositely arranged, thereby providing functions of elastically expanding and compressing to the elastic buckle claw 14. Wherein, inner edges of the top end surfaces at two sides of the elastic buckle claw 14 are respectively connected to the lower connection ring 13 through a connection sheet 142, thereby allowing the two oppositely-arranged retractable slits 141 to be in a sealed state and the elastic buckle claw 14 to be in a sealed arrow-like shape, so when the elastic buckle claw 14 is subject to an external force, the connection effect provided by the connection sheets 142 enable the elastic buckle claw 14 to be prevented from being deformed and damaged, thereby increasing the loading capacity.

The electric conductive spring 2 can be a stretchable and compressible elastic member, the mid portion thereof is defined as a connection portion 21, e.g. but not limited to plural spiral connection rings sleeved on the columnar body 11 of the post member 1, the top and the bottom of the connection portion 21 are respectively and longitudinally extended with an upper and a lower positioning segments 22, 23 received in the upper and the lower through slots 122, 131; the upper and the lower positioning segments 22, 23 are respectively and longitudinally connected with an upper and a lower guide parts 24, 25 composed of plural spiral rings, the upper and the lower guide parts 24, 25 are respectively disposed above of the upper connection ring 12 and between the lower connection ring 13 and the elastic buckle claw 14. In addition, the bottom of the upper guide part 24 is accommodated in the accommodation recessed slot 121, and the top thereof is exposed outside the accommodation recessed slot 121 thereby achieving an elastic abutting effect.

When the post member 1 and the electric conductive spring 2 are assembled, the lower guide part 25 is firstly disposed between the lower connection ring 13 and the elastic buckle claw 14; then the lower positioning segment 23 is accommodated in one of the lower through slots 131 of the lower connection ring 13, then the connection portion 21, e.g. plural spiral connection rings, is sleeved on the columnar body 11 of the post member 1, and the upper positioning segment 22 is accommodated in one of the upper through slots 122 of the upper connection ring 12; lastly the upper guide part 24 is received in the accommodation recessed slot 121 of the upper connection ring 12, thereby forming the partition post shown in the perspective view of FIG. 2.

As shown in FIG. 3, the partition post provided by the present invention is installed on an electric conductive member 3, e.g. a fixed substrate made of a metal sheet, and a printed circuit board 4. When being installed, the arrow-shaped elastic buckle claw 14 is aimed at and inserted into a positioning hole 31 preset on the electric conductive member 3, so the two opposite retractable slits 141 of the elastic buckle claw 14 are compressed by the positioning hole 31 thereby being deformed and enabled to immediately expand right after passing the positioning hole 31, thereby forming a buckle state. At this moment, the bottom of the electric conductive spring 2 and the lower guide part 25 below the lower connection ring 13 are directly and elastically abutted against the electric conductive member 3. Then, the printed circuit board 4 is provided and supported on the partition post, such that the top of the electric conductive spring 2 and the upper guide part 24 accommodated in the accommodation recessed slot 121 are enabled to be directly and elastically abutted against a copper foil circuit 41 at the bottom surface of the printed circuit board 4, thereby forming an electric conductive state, so static electricity and/or noise signal generated by each electric component on the printed circuit board 4 can be transmitted through the electric conductive spring 2 to the electric conductive member 3, e.g. a fixed substrate, thereby being equipped with an anticipated grounding effect.

As shown in FIG. 4, which discloses the partition post according to the second embodiment of the present invention, for the purpose of full and clear disclosure, the components adopted in this embodiment which the same as the components disclosed in the first embodiment are provided with the same terms and the same codes. The difference between the partition post disclosed in this embodiment and in the first embodiment is that: the upper connection ring 12 is not formed with an accommodation recessed slot, the top surface of the upper connection ring 12 is longitudinally and protrudingly installed with an insertion pin 123 having the top integrally formed with a conical part 124 thereby being facilitated to be guided and inserted in a board hole preset on the printed circuit board 4. As shown in FIG. 5, which is a perspective view showing the assembly of the post member 1 and the electric conductive spring 2, the upper guide part 24 spirally surrounds the outer side of the insertion pin 123 thereby providing an elastic abutting effect.

As shown in FIG. 6, which is a view illustrating the partition post being installed on a printed circuit board 4 and an electric conductive member 3, e.g. a fixed substrate made of a metal sheet. When being assembled, the arrow-shaped elastic buckle claw 14 of the partition post is aimed at and inserted into a positioning hole 31 preset on the electric conductive member 3, so the two opposite retractable slits 141 of the elastic buckle claw 14 are compressed by the positioning hole 31 thereby being deformed and enabled to immediately expand right after passing the positioning hole 31, thereby forming a buckle state. At this moment, the bottom of the electric conductive spring 2 and the lower guide part 25 below the lower connection ring 13 are directly and elastically abutted against the electric conductive member 3. Then, the printed circuit board 4 is provided on the partition post, such that the conical part 124 formed at the top of the insertion pin 123 can be inserted in the board hole 42 preset on the printed circuit board 4 thereby forming a supporting and positioning effect, and the top of the electric conductive spring 2 and the upper guide part 24 above the upper connection ring 12 are enabled to be directly and elastically abutted against a copper foil circuit 41 at the bottom surface of the printed circuit board 4, thereby forming an electric conductive state, so static electricity and/or noise signal generated by each electric component on the printed circuit board 4 can be transmitted through the electric conductive spring 2 to the electric conductive member 3, e.g. a fixed substrate, thereby being equipped with an anticipated grounding effect.

As shown in FIG. 7, which discloses the partition post according to the third embodiment of the present invention, for the purpose of full and clear disclosure, the components adopted in this embodiment which the same as the components disclosed in the first and the second embodiments are provided with the same terms and the same codes. The difference between the partition post disclosed in this embodiment and in the previous embodiments is that: the upper connection ring 12 is not formed with an accommodation recessed slot and not installed with an insertion pin, the top surface of the upper connection ring 12 is longitudinally and protrudingly extended with an elastic buckle claw 14 thereby being facilitated to be buckled in a board hole preset on the printed circuit board 4. As shown in FIG. 8, which is a perspective view showing the assembly of the post member 1 and the electric conductive spring 2, the upper guide part 24 spirally surrounds between the upper connection ring 12 and the elastic buckle claw 14 thereby providing an elastic abutting effect.

As shown in FIG. 9, which is a view illustrating the partition post being installed on a printed circuit board 4 and an electric conductive member 3, e.g. a fixed substrate made of a metal sheet. When being assembled, the arrow-shaped elastic buckle claw 14 at the bottom of the partition post is aimed at and inserted into a positioning hole 31 preset on the electric conductive member 3, so the two opposite retractable slits 141 of the elastic buckle claw 14 are compressed by the positioning hole 31 thereby being deformed and enabled to immediately expand right after passing the positioning hole 31, thereby forming a buckle state. At this moment, the bottom of the electric conductive spring 2 and the lower guide part 25 below the lower connection ring 13 are directly and elastically abutted against the electric conductive member 3. Then, the printed circuit board 4 is provided on the partition post, such that the arrow-shaped elastic buckle claw 14 at the top can be inserted in the board hole 42 preset on the printed circuit board 4 thereby forming a supporting and positioning effect, and the top of the electric conductive spring 2 and the upper guide part 24 above the upper connection ring 12 are enabled to be directly and elastically abutted against a copper foil circuit 41 at the bottom surface of the printed circuit board 4, thereby forming an electric conductive state, so static electricity and/or noise signal generated by each electric component on the printed circuit board 4 can be transmitted through the electric conductive spring 2 to the electric conductive member 3, e.g. a fixed substrate, thereby being equipped with an anticipated grounding effect.

As shown in FIG. 10 and FIG. 11, which disclose the partition post according to the fourth embodiment of the present invention, for the purpose of full and clear disclosure, the components adopted in this embodiment which the same as the components disclosed in the previous embodiments are provided with the same terms and the same codes. The difference between the partition post disclosed in this embodiment and in the previous embodiments is that: the connection portion 21 of the electric conducive spring 2 is designed as a linear connection rod, and the upper and the lower through slots 122, 131 of the upper and the lower connection rings 12, 13 are correspondingly installed, thereby enabling the linear connection rod to pass and to be accommodated, so the assembly of the electric conductive spring 2 and the insulation post member 1 is facilitated. One limitation of this embodiment is that the length of the columnar body 11 has to be fixed, while the length of the columnar body 11 sleeved with plural spiral connection rings and disclosed in the previous embodiments is not limited to be fixed, so the columnar body 11 having different length is suitable to be adopted.

As what is disclosed above, the advantages of the present invention are: the partition post of the preset invention not only provides a lifting and partitioning effect between a printed circuit board and an electric conductive member, e.g. a fixed substrate, the partition post also provides the stable supporting or positioning effect to the printed circuit board, and an electric conductive spring is installed on the columnar body of the partition post, so static electricity and/or noise signal generated by each electric component on the printed circuit board can be transmitted through the electric conductive spring to the electric conductive member, e.g. a fixed substrate of a metal housing, thereby providing the grounding effect. In addition, comparing to a conventional electric conductive elastic sheet, the electric conductive spring of the present invention has the advantage of lower cost thereby greatly reducing the production cost. Moreover, the upper and the lower guide parts installed at two sides of the electric conductive spring are provided with advantages of ensuring the elastic abutting connection and stable grounding effect.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A partition post used on a printed circuit board and with an electric conductive member, comprising:

an insulation post member, a top and a bottom of a columnar body defined at a mid portion thereof being respectively and protrudingly installed with an upper and a lower connection rings, peripheries of said upper and said lower connection rings being respectively and longitudinally formed with at least an upper and at least a lower through slots communicating with said columnar body, and a bottom surface of said lower connection ring being longitudinally extended with an arrow-shaped elastic buckle claw having an inner side being formed with at least a retractable slit; and an electric conductive spring, a mid portion thereof defined as a connection portion being connected to said columnar body, a top and a bottom of said connection portion being respectively and longitudinally extended with an upper and a lower positioning segments received in said upper and said lower through slots, said upper and said lower positioning segments being respectively and longitudinally connected with an upper and a lower guide parts composed of plural spiral rings, said electric conductive spring has said upper positioning segment located between said upper guide part and said connection portion and said lower positioning segment located between said connection portion and said lower guide part, said upper and said lower guide parts being respectively disposed above said upper connection ring and between said lower connection ring and said elastic buckle claw;

wherein, said insulation post member is connectable to said printed circuit board and said electric conductive member, when said insulation post member is connected to said printed circuit board and said electric conductive member; said upper guide part of said electric conductive spring is compressed by said printed circuit board and is pressing against and electrically connected with said printed circuit board and said lower guide part of said electric conductive spring is compressed by said electric conductive member and is pressing against and electrically connected with said electric conductive member.

2. The partition post used on a printed circuit board and with an electric conductive member as claimed in claim 1, wherein a top surface of said upper connection ring is formed with an accommodation recessed slot, and a bottom of said upper guide part is accommodated in said accommodation recessed slot, the top is exposed outside said accommodation recessed slot.

3. The partition post used on a printed circuit board and with an electric conductive member as claimed in claim 1, wherein said connection portion is plural spiral connection rings.

4. The partition post used on a printed circuit board and with an electric conductive member as claimed in claim 1, wherein said connection portion is a linear connection rod.

5. The partition post used on a printed circuit board and with an electric conductive member as claimed in claim 1, wherein inner edges of top end surfaces at two sides of said elastic buckle claw are respectively connected to said lower connection ring through a connection sheet, thereby allowing said elastic buckle claw to be formed in sealed arrow-shape.

6. The partition post used on a printed circuit board and with an electric conductive member as claimed in claim 5, wherein said retractable slits at an inner side of said elastic buckle claw formed in sealed arrow-shape are oppositely arranged.

7. A partition post used on a printed circuit board and with an electric conductive member, comprising:

an insulation post member, a top and a bottom of a columnar body defined at a mid portion thereof being respectively and protrudingly installed with an upper and a lower connection rings, peripheries of said upper and said lower connection rings being respectively and longitudinally formed with at least an upper and at least a lower through slots communicating with said columnar body, a top surface of said upper connection ring is longitudinally and protrudingly installed with an insertion pin, and a bottom surface of said lower connection ring being longitudinally extended with an arrow-shaped elastic buckle claw having an inner side being formed with at least a retractable slit; and an electric conductive spring, a mid portion thereof defined as a connection portion being connected to said columnar body, a top and a bottom of said connection portion being respectively and longitudinally extended with an upper and a lower positioning segments received in said upper and said lower through slots, said upper and said lower positioning segments being respectively and longitudinally connected with an upper and a lower guide parts composed of plural spiral rings, said electric conductive spring has said upper positioning segment located between said upper guide part and said connection portion and said lower positioning segment located between said connection portion and said lower guide part, said upper and said lower guide parts being respectively disposed at the outer side of said insertion pin and between said lower connection ring and said elastic buckle claw;

wherein, said insulation post member is connectable to said printed circuit board and said electric conductive member, when said insulation post member is connected to said printed circuit board and said electric conductive member; said upper guide part of said electric conductive spring is compressed by said printed circuit board and is pressing against and electrically connected with said printed circuit board and said lower guide part of said electric conductive spring is compressed by said electric conductive member and is pressing against and electrically connected with said electric conductive member.

8. The partition post used on a printed circuit board and with an electric conductive member as claimed in claim 7, wherein a top of said insertion pin is integrally formed with a conical part.

9. The partition post used on a printed circuit board and with an electric conductive member as claimed in claim 7, wherein said connection portion is plural spiral connection rings.

10. The partition post used on a printed circuit board and with an electric conductive member as claimed in claim 7, wherein said connection portion is a linear connection rod.

11. The partition post used on a printed circuit board and with an electric conductive member as claimed in claim 7, wherein inner edges of top end surfaces at two sides of said elastic buckle claw are respectively connected to said lower connection ring through a connection sheet, thereby allowing said elastic buckle claw to be formed in sealed arrow-shape.

12. The partition post used on a printed circuit board and with an electric conductive member as claimed in claim 11, wherein said retractable slits at an inner side of said elastic buckle claw formed in sealed arrow-shape are oppositely arranged.

13. A partition post used on a printed circuit board and with an electric conductive member, comprising:

an insulation post member, a top and a bottom of a columnar body defined at a mid portion thereof being respectively and protrudingly installed with an upper and a lower connection rings, peripheries of said upper and said lower connection rings being respectively and longitudinally formed with at least an upper and at least a lower through slots communicating with said columnar body, and a top surface of said upper connection ring and a bottom surface of said lower connection ring being respectively and longitudinally extended with an arrow-shaped elastic buckle claw having a inner side being formed with at least a retractable slit; and an electric conductive spring, a mid portion thereof defined as a connection portion being connected to said columnar body, a top and a bottom of said connection portion being respectively and longitudinally extended with an upper and a lower positioning segments received in said upper and said lower through slots, said upper and said lower positioning segments being respectively and longitudinally connected with an upper and a lower guide parts composed of plural spiral rings, said electric conductive spring has said upper positioning segment located between said upper guide part and said connection portion and said lower positioning segment located between said connection portion and said lower guide part, said upper and said lower guide parts being respectively disposed between said upper connection ring and said elastic buckle claw and between said lower connection ring and said elastic buckle claw;

wherein, said insulation post member is connectable to said printed circuit board and said electric conductive member, when said insulation post member is connected to said printed circuit board and said electric conductive member; said upper guide part of said electric conductive spring is compressed by said printed circuit board and is pressing against and electrically connected with said printed circuit board and said lower guide part of said electric conductive spring is compressed by said electric conductive member and is pressing against and electrically connected with said electric conductive member.

14. The partition post used on a printed circuit board and with an electric conductive member as claimed in claim 13, wherein said connection portion is plural spiral connection rings.

15. The partition post used on a printed circuit board and with an electric conductive member as claimed in claim 13, wherein said connection portion is a linear connection rod.

16. The partition post used on a printed circuit board and with an electric conductive member as claimed in claim 13, wherein inner edges of top end surfaces at two sides of said elastic buckle claw are respectively connected to said lower connection ring through a connection sheet, thereby allowing said elastic buckle claw to be formed in sealed arrow-shape.

17. The partition post used on a printed circuit board and with an electric conductive member as claimed in claim 16, wherein said retractable slits at an inner side of said elastic buckle claw formed in sealed arrow-shape are oppositely arranged.

* * * * *